US006118660A

United States Patent [19]

Kaufman

[11] Patent Number: 6,118,660

[45] Date of Patent: Sep. 12, 2000

[54] CIRCUIT MODULE WITH IMPROVED HEAT TRANSFER

[75] Inventor: Lance Kaufman, Scottsdale, Ariz.

[73] Assignee: Teledyne Industries, Inc., Los Angeles, Calif.

[21] Appl. No.: 09/057,141

[22] Filed: Apr. 8, 1998

[51] Int. Cl.$^{7}$ .......... H05K 7/20

[52] U.S. Cl. .......... 361/704; 361/688; 361/709; 361/710; 361/713; 361/719; 361/813; 257/706; 257/707; 257/718; 257/719; 174/16.3; 165/80.3

[58] Field of Search .......... 361/683, 690, 361/703, 704, 707, 709, 710, 713, 715, 719, 720, 813, 748, 760, 783; 165/80.2, 80.3, 104.33; 174/16.3; 257/706, 707, 717–719, 722

[56] References Cited

U.S. PATENT DOCUMENTS 5,184,281 2/1993 Samarov et al. .......... 361/704

*Primary Examiner*—Leo P. Picard
*Assistant Examiner*—Boris L. Chervinsky
*Attorney, Agent, or Firm*—Robert J. Pugh; Patrick J. Viccaro; Allegheny Teledyne Inc.

[57] ABSTRACT

An electronic assembly having one or more heat producing semiconductor components in the form of a chip or die has improved heat dissipation properties. The semiconductor components are formed into subassemblies comprising one or more of the semiconductor components bonded on opposite planar surfaces to metal lead frames. Each lead frame is bonded to a substrate which is electrically insulating and thermally conductive. The resulting assembly is submerged into a central channel of a heat sink. The channel is adapted to receive the assembly such that the channel walls compressingly engage the assembly. Heat is thereby dissipated from the semiconductor components from both planar surfaces of the component.

12 Claims, 4 Drawing Sheets

24 24A 24 24A 9 310 31 33 34 31 33 32 9

24 412 412 310 32 411 411

20A
24A
29A
26A
28A
8
37
32
34
33
31
2
302
333
331
311
22
39
28
26
20
29
24
310
320A
320

24
24A
24
24A 9
310
9
31
33
34
31
33
32

24
412
412
310
32
411
411

310
20
20A
4
4
2
2
33
99
99

302

CIRCUIT MODULE WITH IMPROVED HEAT TRANSFER

BACKGROUND OF THE INVENTION

This invention pertains to arrangements for enhancing heat transfer from semiconductor power switching devices.

In solid state relays and power bridge circuits relatively high current power is conducted through semiconductor devices. The transfer of heat from such semiconductor devices is essential to their operation. Heat conducting, electrically insulating substrates have been advantageously employed to retain heat generating electrical components along a first substrate side while the opposite side of the substrate is mounted on a heat sink to permit the heat generated by the device to be dissipated at the external heat sink. In these arrangements, approximately 90% of the heat generated by the device is transferred through the substrate to the heat sink. The ability of these one sided heat transfer dissipation arrangements to transfer heat limits the use of these arrangements to lower power devices.

For high current, high power devices such as devices handling currents of 200 amps or higher, various arrangements have been provided to dissipate heat from two sides of the semiconductor device. In these arrangements, solder is ineffective to bond the device electrically because of the temperatures involved and a mechanical connection is made to the device. The device is clamped between two plates which act as electrical contacts and also function as heat sinks such that the device dissipates heat from both sides. These very high current arrangements are available commercially and one type is known as a press pack arrangement.

In certain circuit modules the currents are high currents and the heat to be dissipated is too high to permit compact construction using one sided heat dissipation but the amount of heat to be generated is not at the levels for which press pack construction is desirable.

SUMMARY OF THE INVENTION

The present invention pertains to an arrangement for the extraction of heat from semiconductor devices. In accordance with the invention, one or more devices are mounted in a sandwich like construction which is then mounted in a center channel of a heat sink. The sandwich like construction comprises a two lead frames, each bonded to the opposite surface of the semiconductor device. The lead frames are each bonded to a respective one of two electrically insulating but heat conducting insulators or substrates. The resulting subassembly is submerged in and captured in a central channel formed in a heat sink. The heat sink channel is adapted such that its side walls compressingly engage the insulators or substrates. With this construction, heat is extracted from both planar surfaces of the semiconductor device through the lead frames and through the substrates to the heat sink.

BRIEF DESCRIPTION OF THE DRAWING

The invention will be better understood from a reading of the following detailed description taken in conjunction with the drawing in which like reference designators are used to identify like elements, and in which.

DETAILED DESCRIPTION

Figure 1:
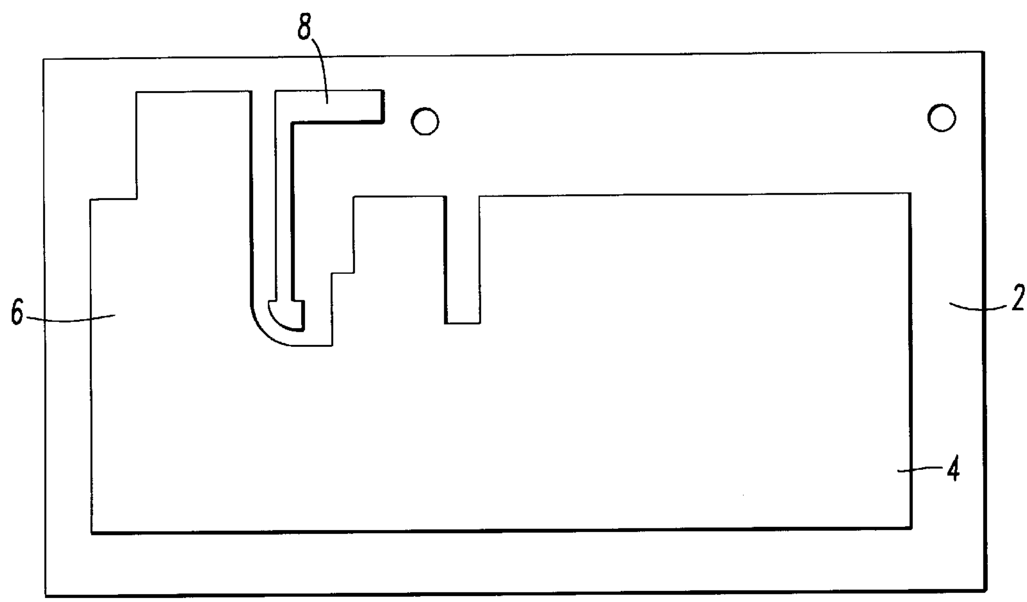
FIG. 1 illustrates a portion of a circuit module in accordance with the principles of the invention.
Figure 2:
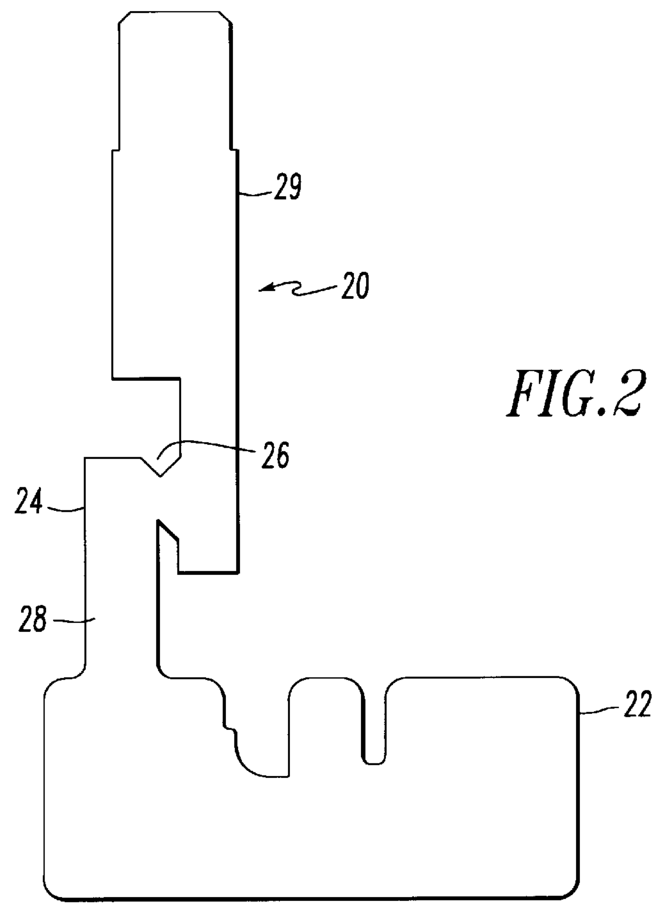
FIG. 2 illustrates a lead frame utilized in a module in accordance with the invention.
Figure 3:
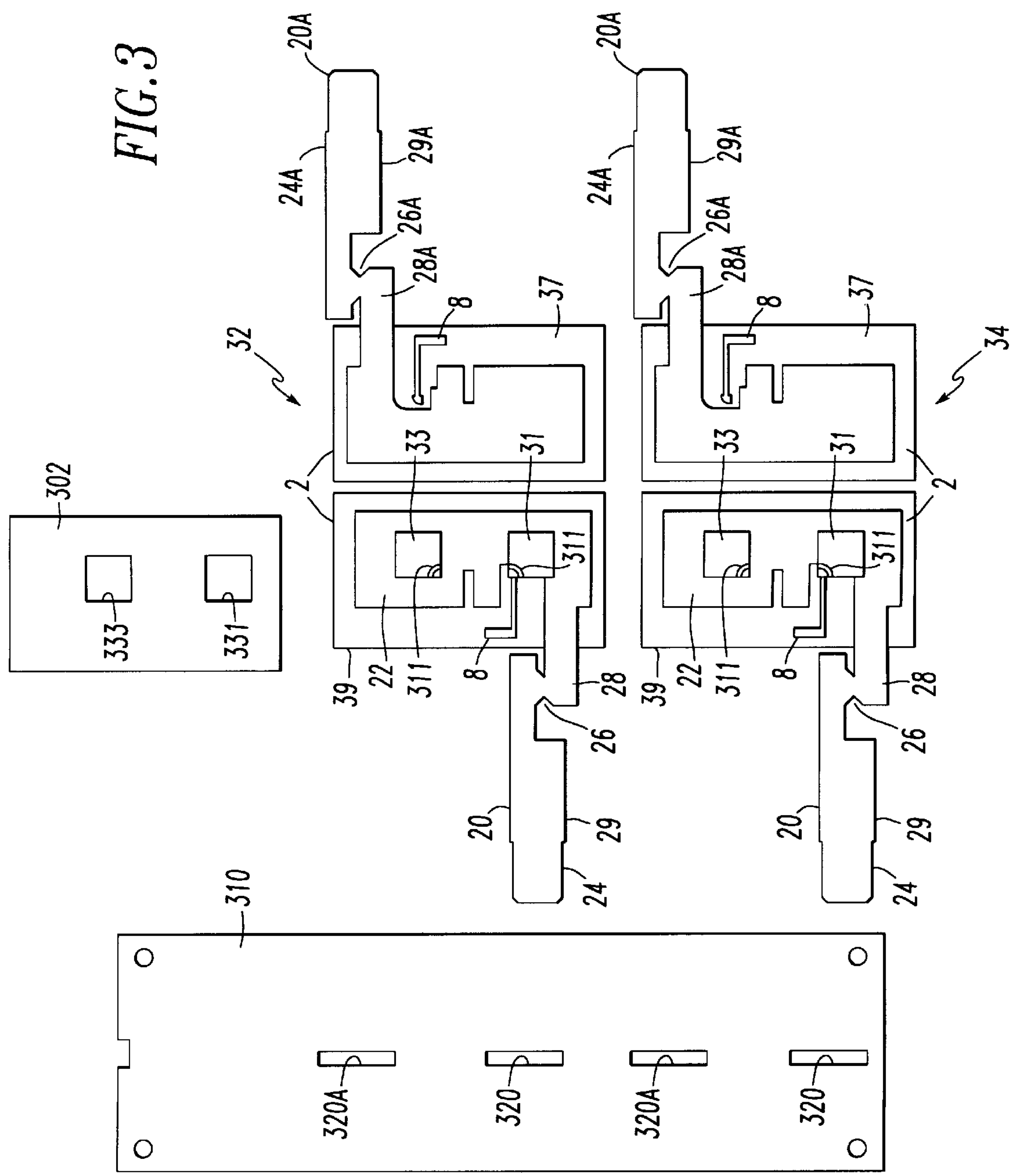
FIG. 3 illustrates in planar view various elements of a circuit module in accordance with the principles of the invention.

A circuit module in accordance with the invention will be described in conjunction with and illustrative embodiment of the invention which is a high current solid state relay module which utilizes two identical circuit subassemblies. Each circuit subassembly includes two semiconductor devices in the form of a chip or die mounted between two lead frames. In the illustrative embodiment, the semiconductor devices are silicon controlled rectifiers (SCR's), but may, for example, be semiconductor diodes or other semiconductor devices in other circuits. A circuit module in accordance with the invention comprises a sandwich construction in which the outer layers each comprise an insulating polymid layer as shown in FIG. 1. The insulating layer has high thermal conductivity and may be of another material such as ceramic or any other electrically insulating, heat conducting material. The insulating layer 2 has a copper metallization pattern or layer 4 formed on one surface thereof. In the relay circuit of the illustrative embodiment, the insulating layer is a 0.001 inch thick layer of polymid to which a copper layer 0.0007 inch thick is bonded. The copper layer 4 includes a first portion 6 to which a lead frame is soldered and a second portion 8 to which the gate area of the semiconductor device is electrically connected to and to which a wire lead is solder bonded. The lead frame 20 is shown in FIG. 2 and includes a first portion 22 which is sized to substantially overlay the copper layer 6 on the insulating layer or substrate 2. A contact arm 24 extends from the portion 22. The arm 24 includes a narrow neck region 26 which facilitates bending of the arm 24 such that the upper portion 29 of arm 24 is perpendicular to the lower portion 28 of arm 24. The lead frame is of copper alloy and is 0.032 inches thick. A second lead frame 20A is shown in FIG. 3 and includes a first portion 22A which is comparable to portion 22 of lead frame 20. An arm 24A extends from the portion 22A and includes a narrow neck region 26A to facilitate bending of the arm 24A such that the upper portion 29A is perpendicular to the lower portion 24A in the assembled module. The arms 24 and 24A are made different in the illustrative embodiment as a matter of design choice determined by the spacing of the upper arm portions 29 and 29A in the final assembly. In other embodiments, the lead frames may be made identical in configuration.

Turning now to FIG. 3, the various components which are assembled together to form a circuit assembly in accordance with the principles of the invention are shown. In the illustrative solid state relay device, four identical solid state devices are utilized. Two of the devices 31, 33 are used in each of the two circuit assemblies 32, 34.

Each circuit module comprises a first lead frame and substrate subassembly 39 and a second lead frame and substrate assembly 37. The first subassembly 39 includes lead frames 20 solder bonded to the copper layer 4 of an insulating layer or substrate 2. Two semiconductor devices 31 and 33 are bonded to the copper layer. An insulating spacer 302 having apertures 331 and 333 adapted to surround the devices 31 and 33, respectively, is disposed on the surface of the lead frame 20 of each circuit assembly 32 and 34 although only one insulating spacer 302 is shown in FIG. 3. The insulating spacer 302 is formed from an insulating material available from Dupont Corporation and known as Kapton. The spacer 302 is 0.003 inches thick. As shown in FIG. 3, the semiconductor devices 31 are disposed on the substrate 2 of subassembly 39 with a control gate portion 311 of the device 31 facing downward to second copper portion 8. The semiconductor devices 33 are each disposed on lead frame 20 with their respective gate portions 311 facing up. Lead frames 20A are similarly bonded to substrates 2 to form subassemblies 37. The substrate and lead frame subassemblies 37 are disposed on the subassemblies 39 and the semiconductor devices 31 and 33 are bonded to the lead frames 20A. Each resulting circuit assembly 32, 34 is thus of a sandwich construction.

A circuit board 310 is also shown in FIG. 3 The circuit board includes appropriate circuitry to operate with the semiconductor devices 31, 33 of the circuit subassemblies 32 and 34. The specific circuitry which is included on the circuit board 310 does not form part of the present invention and therefore is not shown so that the present invention may be shown with greater clarity. The circuit board may be any circuit board type generally utilized and would typically include printed circuit wiring on at least one surface and may also include various discrete components. Although as will be appreciated by those skilled in the art, the advantages of the present invention are such that the inventive aspects are not intended to be limited to the use of any particular type of circuit board or circuit, nor is it intended to limit the invention to assemblies which utilize any circuit board.

Each of the circuit subassemblies 32 and 34 are assembled to the circuit board 310. To assemble the circuit subassemblies 32 and 34 to the circuit board 310, the contact arms 20 and 20A are respectively inserted through the circuit board through holes 320 and 320A, respectively. The contact arms may be solder bonded to circuit traces on the circuit board 310. After the arms 20 and 20A are inserted through the circuit board 310, the upper arm portions 29 and 29A may be bent perpendicular to the lower arm portions 28 and 28A, respectively, of the subassemblies 32 and 34.

Figure 4:
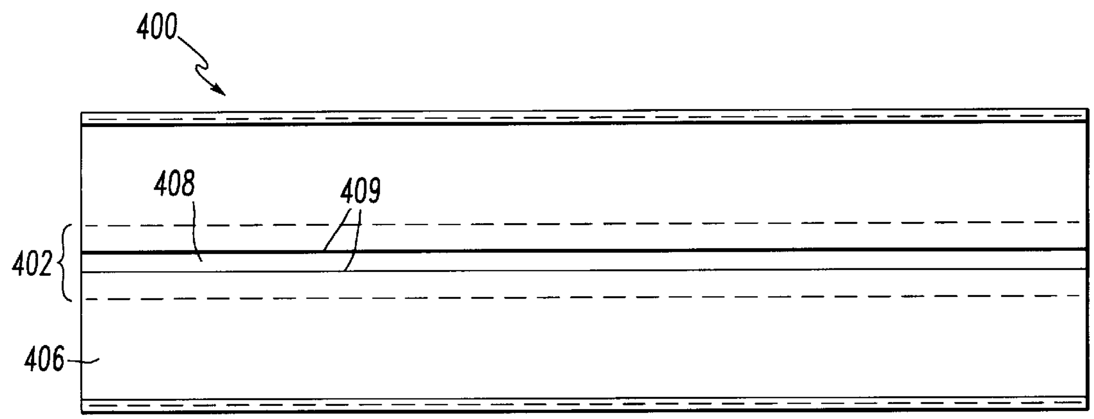
FIGS. 4, 5 and 6 illustrate a heat sink in accordance with the principles of the invention.
Figure 5:
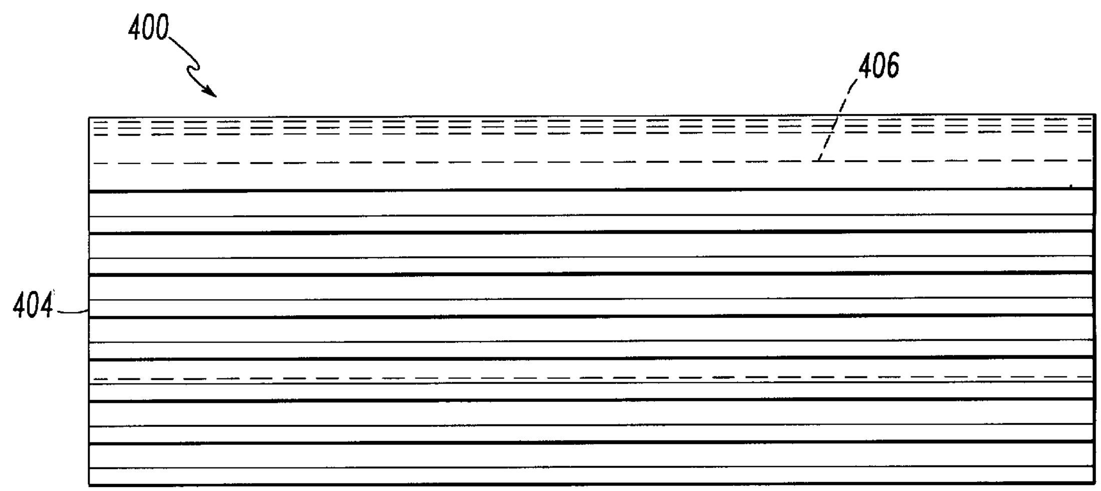
Figure 6:
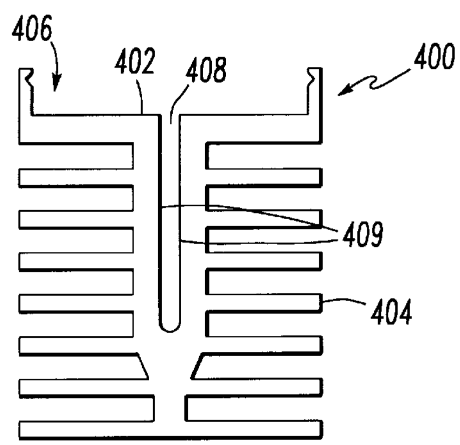
Figure 7:
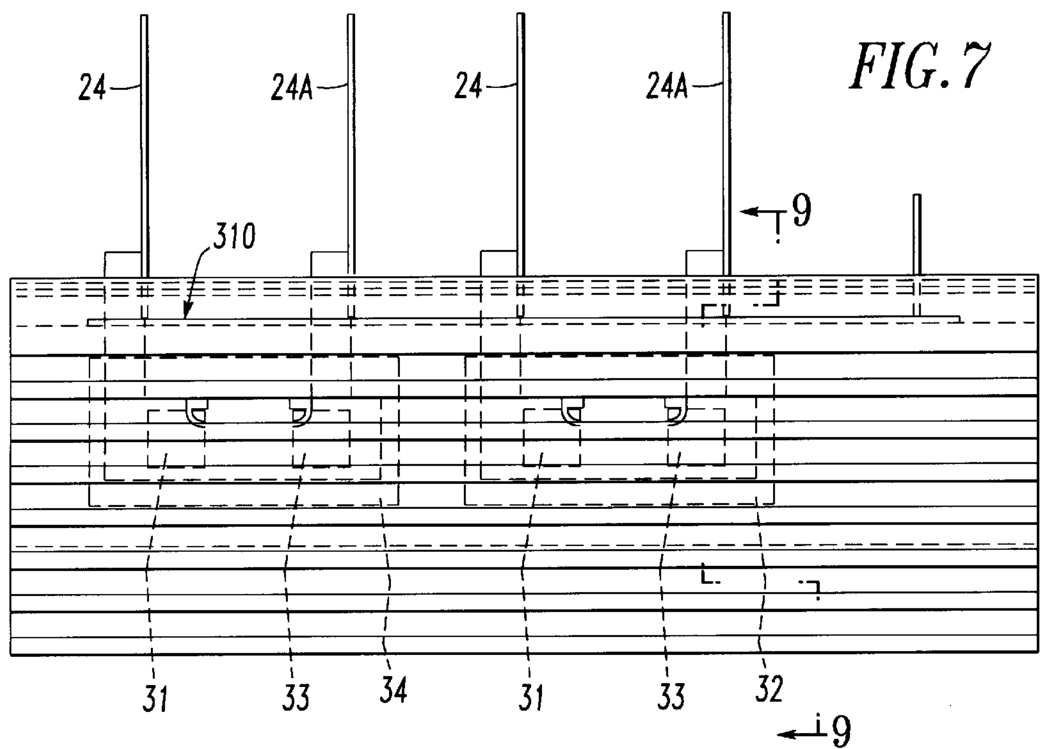
FIGS. 7 and 8 illustrate an assembled circuit module in accordance with the principles of the invention.

The resulting assemblage of the circuit subassemblies 32 and 34 with the circuit board 310 is then assembled to the heat sink shown in FIGS. 4, 5 and 6. The heat sink 400 is an aluminum extrusion. The heat sink includes a central portion 402. Extending from the central portion are heat transfer fins 404. The heat fins 404 are of equal size and number on both sides of the heat sink 400. The top of the heat sink as shown in the drawing figures includes a channel 406 which is sized to receive the circuit board 310 shown in FIG. 3. The central portion 402 includes a channel 408 which extends along the entire length of the heat sink 400. The channel 408 has a depth into the central portion 402 which is at least equal to the distance that the subassemblies 32 and 34 extend below the circuit board 310. The width of the channel 408 when the subassemblies 32 and 34 are not inserted into channel 408 is less than the thickness of the subassemblies 32 and 34. The width of the channel 408 is such that the side walls 409 of the channel 408 will compressingly engage the insulating or substrate layers of the circuit subassemblies 32 and 34 such that heat will transfer through the substrates 2 on both sides of the subassemblies 32 and 34 to the side walls 409 such that heat will dissipate through the heat sink 400. The dimensions of the heat sink are that it has a length of 4.5 inches, a height of 1.638 inches, a central portion thickness of 0.27 inches, a channel 408 depth of 0.964 inches and a channel 408 width of 0.095 inches. The central portion 402 has an overall width of 0.338 inches.

Figure 8:
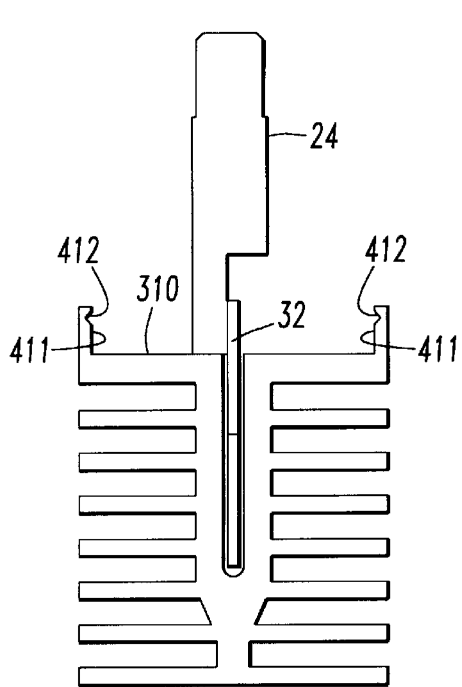
Figure 9:
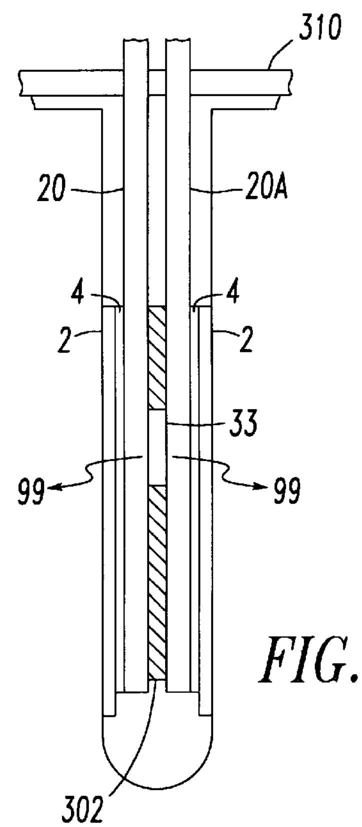
FIG. 9 illustrates a portion of the assemblage of FIGS. 7 and 8 in enlarged cross section taken along lines 9—9 of FIG. 7.

A circuit module assembly in accordance with the invention is shown in FIGS. 8 and 9. To assemble the unit shown in FIGS. 8 and 9, a tool is used to engage the upper walls 411 of the channel 406. The walls 411 each include a notch 412 to facilitate engagement of the walls 411 by a spreading tool. By exerting outward directed forces against the walls 411, the channel 408 is spread to a width greater than the thickness of the circuit subassemblies 32 and 34. The printed circuit board 310 is disposed above the channel 408 and the circuit assembly is lowered into the channel 408. After the circuit board is moved downward so that the subassemblies 32 and 34 below the circuit board 310 are submerged into the channel 408 and the bottom of the circuit board 310 engages or is in close proximity to the upper surface of the heat sink channel 402, the spreading tool releases the heat sink 400 from the spread apart condition. The memory and inherent resiliency of the heat sink 400 is such that the side walls 409 of the channel 408 when released attempt to return to the original relaxed position and engage the exterior surfaces the substrates or insulating layers of the circuit assemblies 32 and 34. The side walls 409 firmly and compressingly engage and grip the circuit assemblies 32 and 34 such that heat transfer is achieved between the circuit assemblies 32 and 34 and the heat sink 400 from the two planar sides of the circuit assemblies 32 and 34 and thereby dissipating heat from both planar sides of the circuit assemblies 32 and 34. With this arrangement, a higher level of heat transfer may be obtained from semiconductor devices, thereby increasing the heat transfer efficiency from such devices in a manner that has not been previously obtained.

The sandwich like construction of the arrangement of the invention is more clearly shown in FIG. 9. As will be readily appreciated, the heat from semiconductor device 33 is extracted from both planar surfaces thereof in the direction of heat transfer shown by arrows 99.

As will be appreciated by those skilled in the art, the invention has been described in conjunction with a specific illustrative embodiment and various changes and modifications may be made without departing form the spirit or scope of the invention. It is intended that the invention be limited only by the claims appended hereto.

What is claimed is:

1. A circuit module comprising:

a circuit assembly comprising:

- a heat producing semiconductor device;
- a first insulating substrate, said first substrate having a first metallization pattern formed on one surface thereof;
- a second insulating substrate, said second substrate having a second metallization pattern formed on one surface thereof, said first and second substrates each having a high thermal conductivity;
- a first heat and electrically conductive lead frame, said first lead frame being substantially thicker than said first metallization pattern, said first lead frame being bonded to said first metallization pattern, said semiconductor component having a first planar surface bonded to said first lead frame;
- a second heat and electrically conductive lead frame, said second lead frame being substantially thicker than said second metallization pattern, said second lead frame being bonded to said second metallization pattern, said semiconductor component having a second planar surface opposite said first planar surface bonded to said second lead frame;

a heat sink, said heat sink having a channel, said channel having first and second side walls, said channel receiving said circuit assembly such that said first and second side walls compressingly engage said first and second insulating substrates, respectively, whereby heat is dissipated from said first and second planar surfaces of said semiconductor component.

2. A circuit module in accordance with claim 1, comprising:

a second circuit assembly disposed in said channel.

3. A circuit module in accordance with claim 1, comprising:

a second heat producing semiconductor component, said second component being disposed between and bonded to said first and second electrically conductive lead frames.

4. A circuit module in accordance with claim 3, wherein:

said first and second lead frames each comprise a metal.

5. A circuit module in accordance with claim 3, wherein:

said first and second semiconductor components comprise silicon controlled rectifiers.

6. A circuit module in accordance with claim 1, wherein:

said heat sink includes finned portions disposed on either side of said channel.

7. A circuit module in accordance with claim 1, comprising:

a circuit board, said circuit assembly being disposed below said circuit board;

said heat sink comprising a second channel, said second channel receiving said circuit board.

8. A circuit module in accordance with claim 1, wherein:

said heat sink includes first and second portions adapted to be engaged by a tool, such that said channel, which has a width, may be spread from a first relaxed position to a second open position wherein the width of said channel is greater in said second position than the width of said channel in said first relaxed position, said width in said second position being greater than the width of said circuit subassembly, said heat sink having inherent memory such that when said channel is not retained in said second position, said side walls compressingly engage said circuit subassembly.

9. A circuit module in accordance with claim 8, wherein:

said heat sink comprises aluminum.

10. A method of extracting and dissipating heat from a heat producing semiconductor component having a first planar surface and an opposite disposed second planar surface, said method comprising:

bonding a first metal lead frame on a first electrically insulating and heat conducting substrate;

bonding a second metal lead frame on a second electrically insulating and heat conducting substrate;

disposing said semiconductor component between said first and second metal lead frames and bonding said semiconductor component first planar surface to said first lead frame and bonding said second planar surface to said second lead frame, whereby a subassembly having a first thickness is formed;

mounting said subassembly in a heat sink having a central channel, said channel having first and second side walls, said central channel having a width between said first and second side walls less than said first thickness, said subassembly being mounted such that said first and second side walls compressingly engage said subassembly such that heat generated by said component will be dissipated to said heat sink from said first and second planar surfaces.

11. A method in accordance with claim 10, comprising:

engaging said heat sink with a tool during assembly to spread apart said first and second side walls to a position such that the distance between said first and second side walls is greater than the thickness of said subassembly;

inserting said subassembly into said channel;

releasing said tool such that said first and second heat sink walls compressingly engage said subassembly.

12. An electronic assembly, comprising:

a heat sink comprising a first finned portion, a second finned portion, a channel disposed between said first and second finned portions, said channel having first and second side walls;

a circuit assembly submerged in said channel and compressingly engaged by both said first and second side walls, said circuit assembly comprising a heat producing semiconductor component, said component having a first planar surface and a second opposite disposed planar surface, said circuit assembly further comprising a first lead frame bonded to said first planar surface, a second lead frame bonded to said second planar surface, a first electrically insulating and heat conducting substrate bonded to said first lead frame opposite said semiconductor component, a second electrically insulating and heat conducting substrate bonded to said first lead frame opposite said semiconductor component, whereby heat is dissipated from said first planar surface through said first lead frame through said first substrate to said first wall and heat is dissipated from said second planar surface through said second lead frame through said second substrate to said second wall.

* * * * *

UNITED STATES PATENT AND TRADEMARK OFFICE
CERTIFICATE OF CORRECTION

PATENT NO. : 6,118,660
DATED : September 12, 2000
INVENTOR(S) : Kaufman

It is certified that error appears in the above-identified patent and that said Letters Patent is hereby corrected as shown below:

Column 1,
Line 47, delete "a".

Column 4,
Line 41, delete "form" and insert -- from -- therefore.

Signed and Sealed this

Twentieth Day of April, 2004

JON W. DUDAS
*Acting Director of the United States Patent and Trademark Office*